United States Patent
Ku et al.

(10) Patent No.: US 7,683,645 B2
(45) Date of Patent: Mar. 23, 2010

(54) HIGH-FREQUENCY PROBE CARD AND TRANSMISSION LINE FOR HIGH-FREQUENCY PROBE CARD

(75) Inventors: Wei-Cheng Ku, Hsinchu Hsiang (TW); Hsin-Hung Lin, Hsinchu Hsiang (TW); Chih-Hao Ho, Hsinchu Hsiang (TW); Te-Chen Feng, Hsinchu Hsiang (TW)

(73) Assignee: MPI Corporation, Chu-Pei, Hsinchu Shien (TW)

( * ) Notice: Subject to any disclaimer, the term of this patent is extended or adjusted under 35 U.S.C. 154(b) by 332 days.

(21) Appl. No.: 11/583,740

(22) Filed: Oct. 20, 2006

(65) Prior Publication Data

US 2008/0007278 A1 Jan. 10, 2008

(51) Int. Cl.
*G01R 31/02* (2006.01)

(52) U.S. Cl. .................................... 324/754

(58) Field of Classification Search ........... None
See application file for complete search history.

(56) References Cited

U.S. PATENT DOCUMENTS

| | | | | |
|---|---|---|---|---|
| 4,901,013 | A * | 2/1990 | Benedetto et al. | 324/761 |
| 5,461,327 | A * | 10/1995 | Shibata et al. | 324/760 |
| 5,525,911 | A * | 6/1996 | Marumo et al. | 324/754 |
| 6,292,003 | B1 * | 9/2001 | Fredrickson et al. | 324/754 |
| 6,853,208 | B2 * | 2/2005 | Okubo et al. | 324/758 |
| 6,861,858 | B2 * | 3/2005 | Chen et al. | 324/755 |
| 7,368,928 | B2 * | 5/2008 | Lin et al. | 324/754 |
| 7,400,156 | B2 * | 7/2008 | Wu et al. | 324/754 |
| 7,595,651 | B2 * | 9/2009 | Ku et al. | 324/754 |
| 2002/0041189 | A1 * | 4/2002 | Okubo et al. | 324/754 |
| 2004/0124862 | A1 * | 7/2004 | Sugawara | 324/754 |
| 2006/0066328 | A1 * | 3/2006 | Clegg et al. | 324/754 |
| 2007/0200584 | A1 * | 8/2007 | Ku | 324/761 |
| 2008/0054918 | A1 * | 3/2008 | Lin et al. | 324/754 |
| 2008/0164900 | A1 * | 7/2008 | Ku et al. | 324/762 |
| 2008/0191726 | A1 * | 8/2008 | Ku et al. | 324/762 |
| 2009/0009198 | A1 * | 1/2009 | Ku et al. | 324/754 |
| 2009/0212801 | A1 * | 8/2009 | Ku et al. | 324/754 |

FOREIGN PATENT DOCUMENTS

| | | |
|---|---|---|
| JP | 58182217 | 10/1983 |
| JP | 60168213 | 11/1985 |
| JP | 61133876 A * | 6/1986 |

(Continued)

*Primary Examiner*—Jermele M Hollington
(74) *Attorney, Agent, or Firm*—Browdy and Neimark, PLLC (57) ABSTRACT

A high-frequency probe card includes a circuit board having signal circuits and grounding circuits, transmission lines each having a bi-wire structure including a first lead wire for transmitting high-frequency signal and a second lead wire connected to the grounding circuits, and signal probes. High-frequency test signal provided by a test machine to the signal circuits can be transmitted to the signal probes through the first lead wires. Since the grounding circuits and second lead wires are provided adjacent to the signal circuits and first lead wires respectively, the high-frequency signal can be efficiently transmitted and the characteristic impedance matching can be maintained during high-frequency signal transmission. The bi-wire structure of the transmission lines has a diameter equal to or less than 1 millimeter, thereby allowing installation of a big number of the transmission lines such that the high-frequency test for a big number of electronic elements can be realized.

21 Claims, 11 Drawing Sheets

FOREIGN PATENT DOCUMENTS

| | | | |
|---|---|---|---|
| JP | 01116452 A * | 5/1989 | |
| JP | 1990050452 | 2/1990 | |
| JP | 1992127577 | 11/1992 | |
| JP | 08136582 A * | 5/1996 | |
| JP | 1997218222 | 8/1997 | |
| JP | 1999030630 | 2/1999 | |
| JP | 2001021584 | 1/2001 | |
| JP | 2001228173 | 8/2001 | |
| JP | 2004125548 | 4/2004 | |
| JP | 2008032533 A * | 2/2008 | |

* cited by examiner

HIGH-FREQUENCY PROBE CARD AND TRANSMISSION LINE FOR HIGH-FREQUENCY PROBE CARD

BACKGROUND OF THE INVENTION

1. Field of the Invention

The present invention relates to probe cards and more particularly, to a high-frequency probe card that requires less installation space for transmission lines.

2. Description of the Related Art

A probe card is a testing card having a circuit board and a plurality of downwardly extending probes for probing the contact pads on an integrated semiconductor wafer for transmitting test signals subject to the control of a software from a test machine to the integrated circuit of the wafer, thereby performing the wafer level test automatically. The density of the arrangement of the probes must be corresponding to the pitch of the contact pads on the wafer. Further, in order to fit various wafers manufactured by various integrated circuit technologies, the design of the circuit board of a probe card may not use a specific wiring layout for signal transmission between the test machine and the probes. Alternatively, a jumping connection structure of transmission lines may be used and connected between the lead wires probed by the test machine and the probes for allowing signal transmission from the test machines to the probes.

Figure 12:
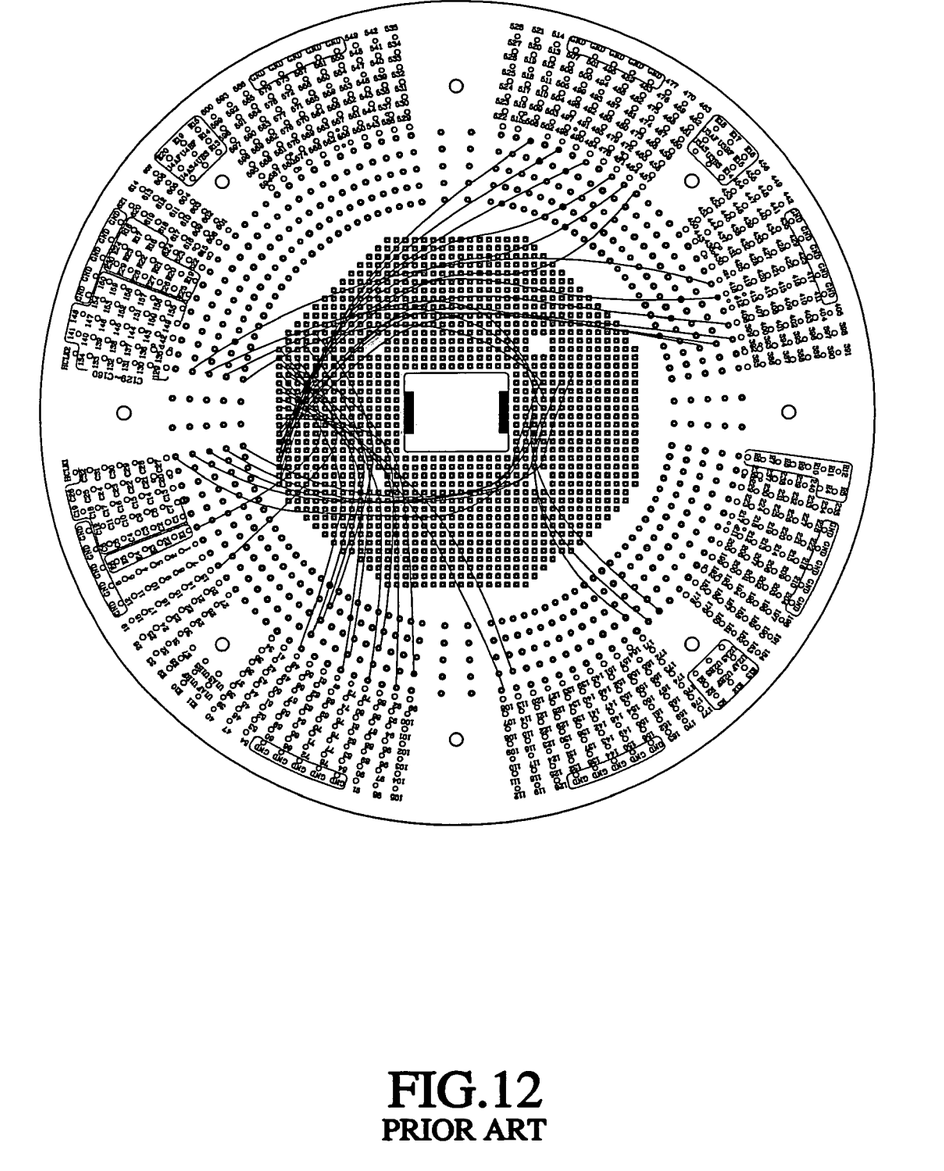
FIG. 12 is a top view of a cantilever type probe card according to the prior art.

Comparing to the probes of a probe card, the diameter of the transmission line is much greater than the diameter of the probe. When connecting the transmission lines to the probes respectively, the transmission lines become densely arranged in the area adjacent to the probes. Following the sophisticated and versatile circuit design of semiconductor wafer, probe cards must be made having a high count of probes to meet wafer level test requirements of multiple test-items for testing circuit device characteristics quickly. In consequence, the installation density of the jumping connection structure of transmission lines becomes critical. In some cases, for example, in the cantilever-type probe card shown in FIG. 12, transmission lines are stacked and crossed over one another for positive connection to their respective probes. This design complicates the module engineering of jumping transmission lines and increases its difficulty level. As considering a coaxial cable for the transmission of high-frequency signals, an electrically insulating plastic layer having a predetermined wall thickness surrounds an axial wire and also be surrounded by an electrically grounded metal shield so that the characteristic impedance of the transmitted signal propagating by the axial wire can be maintained. However, in order to prevent the transmitted signal from characteristic impedance mismatching that may be resulted from dielectric loss of a parasitic capacitance induced by the plastic layer, the plastic layer must have a certain wall thickness determined subject to its dielectric constant. No matter what kinds of the plastic layer of a coaxial cable used, the entire diameter of the coaxial cable is much greater than its axial wire, thus requiring more installation space of the transmission lines. Therefore, a conventional high-frequency probe card does not allow the dense arrangement of the probes respectively connecting to the coaxial cables for high-frequency test probing.

Figure 13:
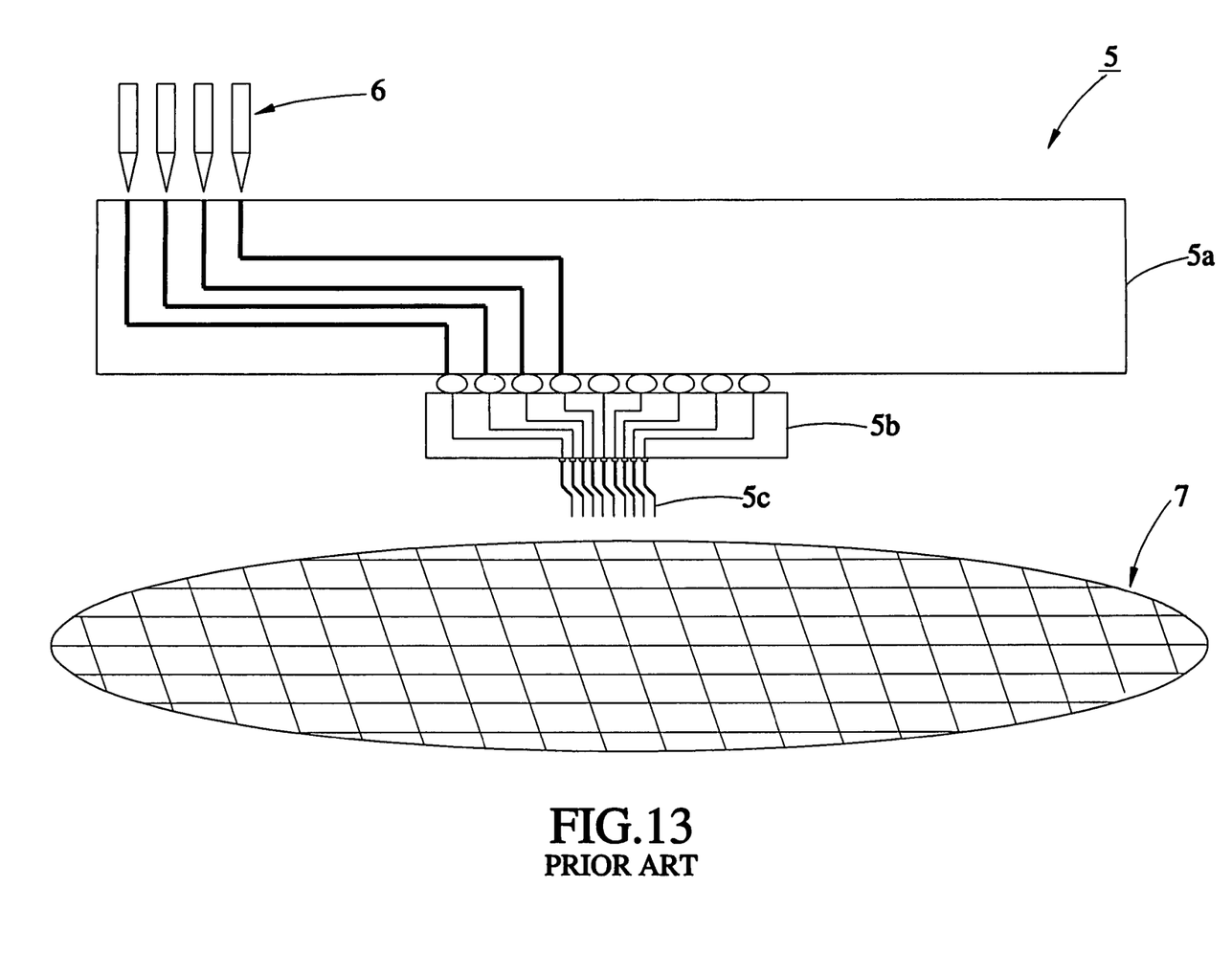
FIG. 13 is a schematic drawing showing the structure of a vertical type probe card according to the prior art.

A probe card may install multi-layer circuit structure of the so-called space converter. For example, FIG. 13 shows a conventional vertical-type probe card 5. According to this design, the vertical-type probe card 5 comprises a circuit board 5a, a space converter 5b, and a plurality of probes 5c stacked at different elevations. The circuit board 5a has arranged thereon a predetermined circuit layout extending from the top surface to the bottom surface for signal transmission. The circuit at the top surface of the circuit board 5a is adapted for the contact of the probing pins 6 of the test machine. The circuit at the bottom surface of the circuit board 5a is for the connection of the space converter 5b. The space converter 5b is formed of a MLC (Multi-Layer Ceramic) or MLO (Multi-Layer Organic) structure. A plurality of electric contacts are arranged on the top and bottom sides of the space converter 5b with different pitches for the respectively electrical connection to the circuit board 5a and the probes 5c. The space converter 5b has laminated circuit layout therein formed by means of the application of semiconductor manufacturing. The pitch of the circuit layout of the space converter 5b that is closer to the probes 5c is relatively smaller so that the lead wires of the circuit board 5a can be respectively conducted to the densely arranged probes 5c, achieving the space conversion effect between the circuit board 5a and the probes 5c to probe the densely arranged electronic devices on the wafer 7. However, the fabrication of the space converter is subject to the application of a micro electromechanical process or thin-film manufacturing, and a specific insulating material like a ceramic substrate may be needed for the base, thereby resulting in a high manufacturing cost greater than the fabrication of the circuit board. There is a demand for a high-frequency probe card that uses an economic circuit structure for signal transmission, maintains characteristic impedance of high-frequency signaling and provides high reliability testing.

SUMMARY OF THE INVENTION

The present invention has been accomplished under the circumstances in view. It is therefore an objective of the present invention to provide a high-frequency probe card, which transmits high-frequency test signals to probes by using a high quality transmission line structure that has a low installation density, thereby effectively simplifying module engineering of setting transmission lines and improving test quality of the high-frequency probe card.

To achieve this objective of the present invention, the high-frequency probe card comprises a circuit board, a plurality of transmission lines, a plurality of signal probes and at least one grounding probe. The circuit board comprises a plurality of signal circuits and grounding circuits respectively spaced from the signal circuits at a predetermined pitch. The grounding circuits are electrically connected to a zero potential of a test machine to block any outside interference away from the respectively surrounded signal circuits and provide the test signals carried by the respective signal circuits with the reference potential of their respective characteristic impedance. The transmission lines are disposed on the circuit board, each having a first lead wire and a second lead wire respectively made of electrically conducting materials and spaced from each other at a predetermined pitch and electrically connected to the signal circuit and the grounding circuit of the circuit board respectively. The signal probes and the at least one grounding probe are made of hard metal materials and electrically connected to the first lead wire and the zero potential of the test machine respectively. The signal probes and the at least one grounding probe each have one end for connection to the circuit board and the other end for contacting a respective conducting bump pad at the test sample.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
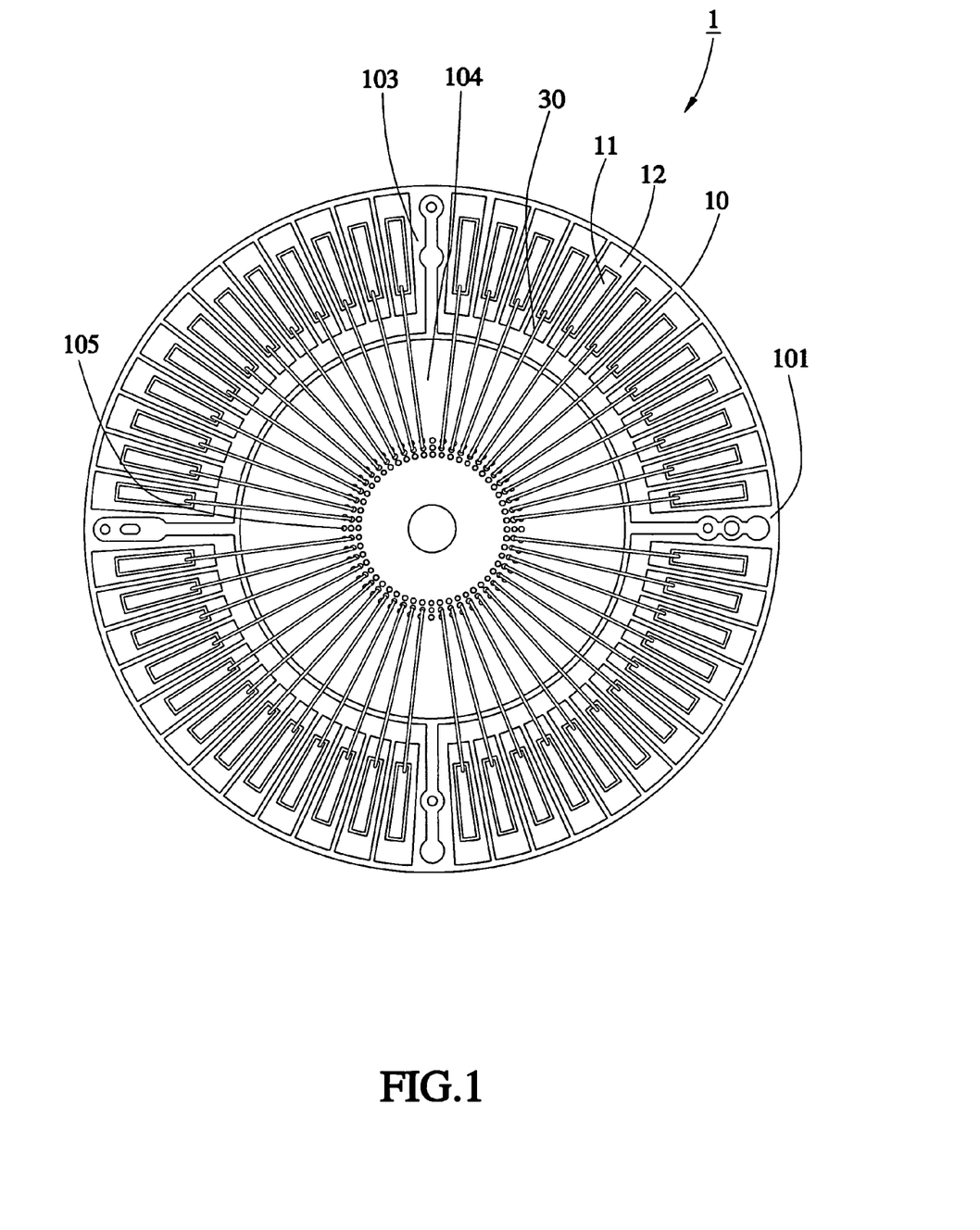
FIG. 1 is a top view of a high-frequency probe card according to a first preferred embodiment of the present invention.
Figure 2:
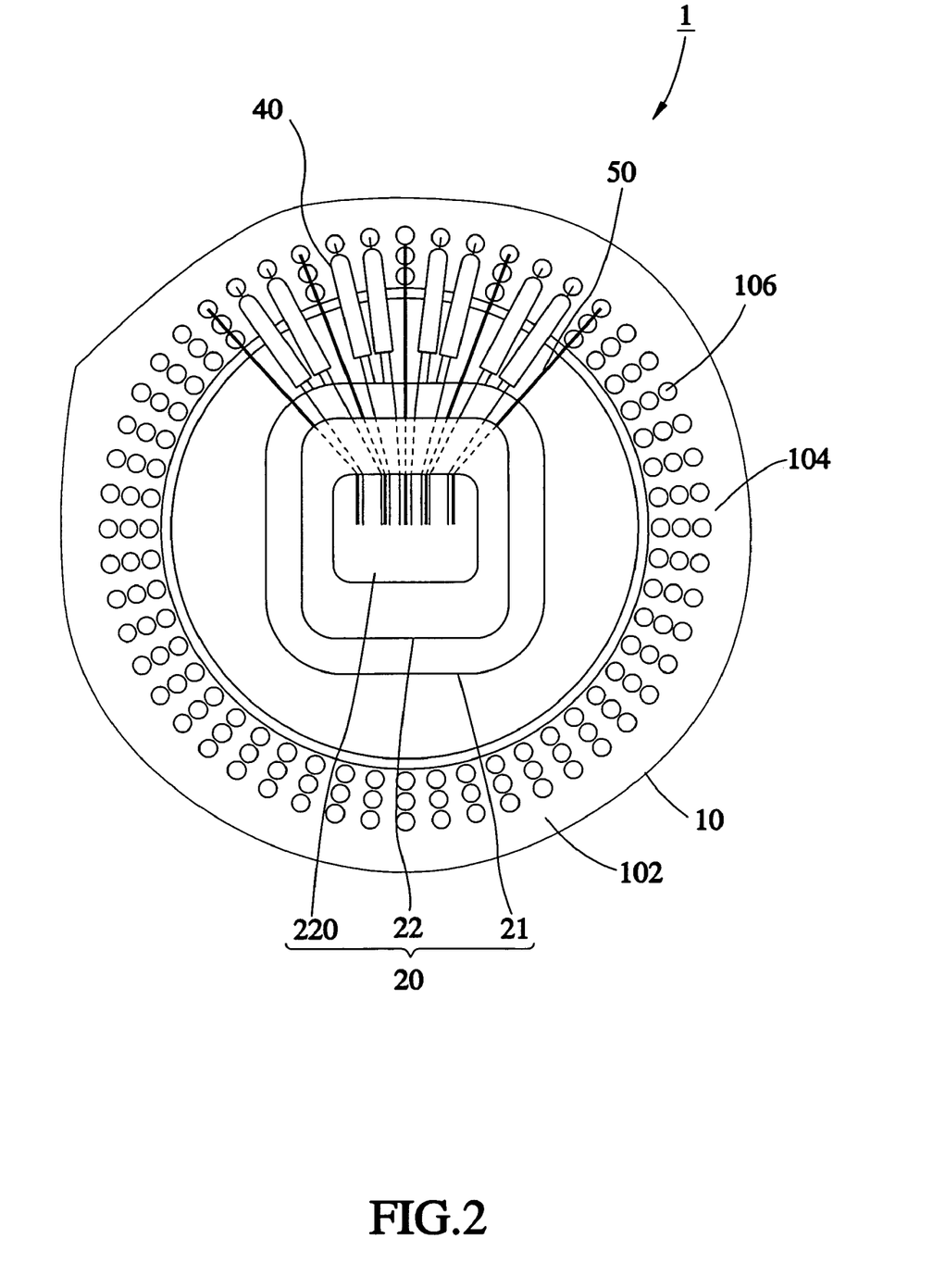
FIG. 2 is a bottom view of the high-frequency probe card according to the first preferred embodiment of the present invention.
Figure 3:
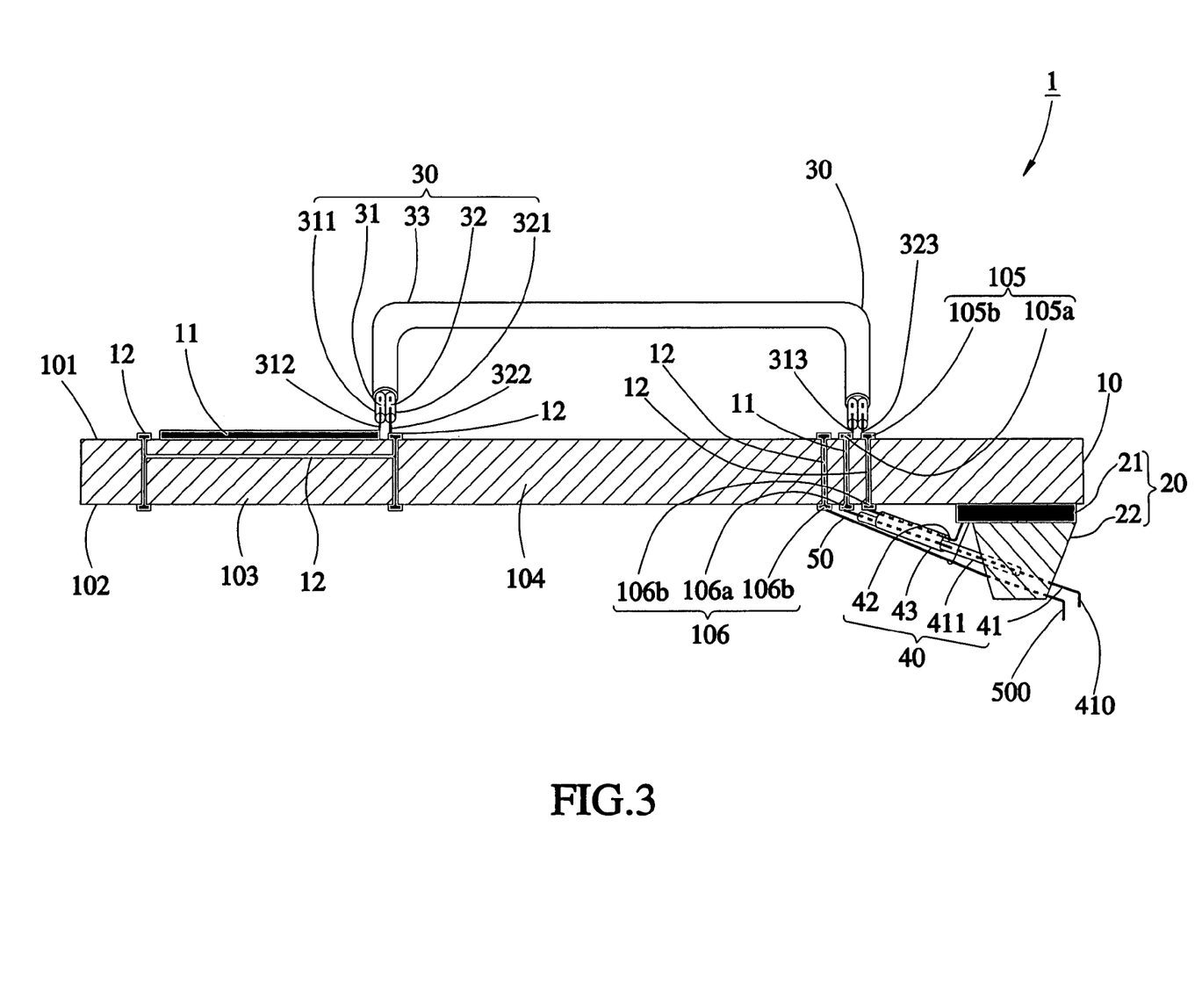
FIG. 3 is a schematic drawing showing the structure of the high-frequency probe card according to the first preferred embodiment of the present invention.

As shown in FIGS. 1-3, a high-frequency probe card 1 in accordance with a first preferred embodiment of the present invention comprises a circuit board 10, a probe holder 20, a plurality of transmission lines 30, a plurality of high-frequency probes 40, and a plurality of grounding probes 50. The circuit board 10 has a top surface 101 and a bottom surface 102, defining an annular outer test zone 103 and an annular inner jumping zone 104 concentrically disposed within the test zone 103. The circuit board 10 has arranged thereon electronic circuits. A plurality of solder pads 105 and 106 are respectively arranged on the top surface 101 and bottom surface 102 within the jumping zone 104. The electronic circuits of the circuit board 10 at the top surface 101 within the test zone 103 are electrically connected to a test machine (not shown), which is controlled to output a high-frequency test signal to the high-frequency probe card 1. The solder pads 105 at the top surface 101 are respectively electrically connected to the transmission lines 30 and to the solder pads 106 at the bottom surface 102. The solder pads 106 at the bottom surface 102 are respectively electrically connected to the probes 40 and 50.

Referring to FIG. 1 again, the electronic circuits of the circuit board 10 include a plurality of signal circuits 11 and grounding circuits 12. The grounding circuits 12 on the top surface 101 within the test zone 103 are respectively spaced around the signal circuits 11 at a predetermined pitch. These signal circuits 11 are adapted to transmit the test signal from the aforesaid test machine. The grounding circuits 12 are electrically connected to the zero potential of the test machine, for blocking any outside interference away from the respectively surrounded signal circuits 12 and providing the test signals carried by the respective signal circuits 12 with the reference potential of their respective characteristic impedance. Please refer also to FIG. 3. Inside the circuit board 10, the grounding circuits 12 within the test zone 103 have a co-planar arrangement of lead wires respectively spaced below the signal circuits 11 at a predetermined distance. Each of the signal circuits 11 and grounding circuits 12 within the jumping zones 104 of the circuit board 10 directly contacts with a solder pad 105 at the top surface 101 and a solder pad 106 at the bottom surface 102.

Referring to FIGS. 2 and 3 again, the probe holder 20 is installed in the bottom surface 102 of the circuit board 10 and surrounded by the jumping zone 104, having a grounding plane 21 and a locating ring 22. The grounding plane 21 is a flat annular surface made of an electrically conducting material and formed on the bottom surface 102 of the circuit board 10. The locating ring 22 is provided on the grounding plane 21 to hold the body of each of the probes 40 and 50, keeping the tip of each of the probes 40 and 50 be suspended in an annular opening 220 surrounded by the locating ring 22. The locating ring 22 is made of an electrically insulating and shock absorbing material, for example, epoxy resin.

Figure 4:
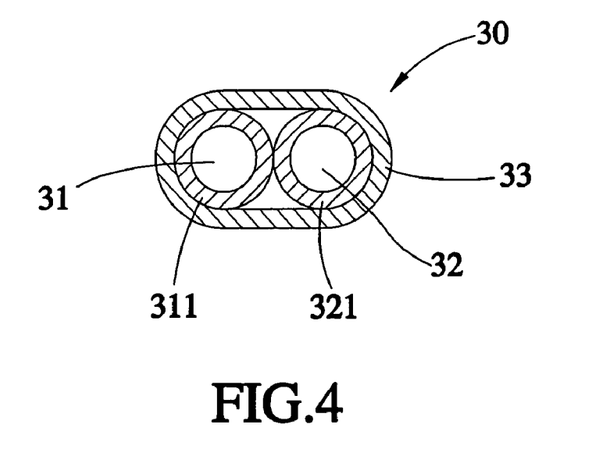
FIG. 4 is a schematic cross sectional view of a transmission line for the high-frequency probe card according to the first preferred embodiment of the present invention.

Referring to FIG. 3 again, the transmission lines 30 are respectively connected to the electronic circuits in the inner side of the test zone 103 of the circuit board 10, and extended to the jumping zone 104 to respectively connect to the solder pads 105 at the top surface 101. Each transmission line 30 has a first lead wire 31 and a second lead wire 32. Each of the first lead wire 31 and the second lead wire 32 is a metal wire axially wrapped with an electrically insulating covering 311 or 321, namely the first covering 311 or the second covering 321. Each transmission line 30 further comprises a sleeve 33 surrounding the first lead wire 31 that is wrapped by the first covering 311 and the second lead wire 32 that is wrapped by the second covering 312 and holding them in place. Each of the first lead wire 31 and the second lead wire 32 has a first end 312 or 322 and a second end 313 or 323. The first end 312 and second end 313 of the first lead wire 31 are respectively connected to the signal circuit 11 and a signal solder pad 105$a$ of the solder pads 105 at the top surface 101. The first end 322 and second end 323 of the second lead wire 32 are respectively connected to the grounding circuit 12 and a grounding solder pad 105$b$ of the solder pads 105 at the top surface 101. Please refer also to FIG. 4. The coverings 311 and 321 of each transmission line 30 protect their respective lead wires 31 and 32 against oxidation and contamination, and provide a specific pitch to keep the lead wires 31 and 32 in parallel within the sleeve 33. The pitch between the lead wires 31 and 32 is equal to the combined wall thickness of the coverings 311 and 321.

Referring to FIGS. 2 and 3 again, each of the high-frequency probes 40 comprises a signal probe 41, a grounding wire 42, and a sleeve 43. The signal probe 41 is made of a hard metal material, having one end electrically connected to a signal solder pad 106a of the solder pads 106 at the bottom surface 102 and the other end terminated in a tip 410 for touching a signal bump pad at the test sample (not shown). The signal probe 41 is also axially covered with a covering 411 that functions in the same manner as the coverings 311 of the transmission lines 30. The front section of the signal probe 41 is arranged between the locating ring 22 and the solder pads 106, and parallel with the grounding wire 42, and surrounded with the grounding wire 42 by the sleeve 43. The two distal ends of the grounding wire 42 are respectively connected to a grounding solder pad 106b of the solder pads 106 and the grounding plane 21. Because the signal solder pads 106a and the grounding solder pads 106b are directly electrical connected to the respective signal solder pads 105a and the grounding solder pads 105b through the circuit board 10, the signal probe 41 of the high-frequency probe 40 can transmit the test signal passed by the transmission line 30 to the test sample. The grounding wire 42 of each high-frequency probe 40 is grounded, maintaining the characteristic impedance of the signal passed by the associated signal probe 41. The grounding probe 50 is made of a hard metal material, having one end electrically connected to one grounding solder pad 106b and the other end terminated in a tip 500 for touching a grounding bump pad at the test sample (not shown). Further, the body of each grounding probe 50 is electrically connected to the grounding plane 21 of the probe holder 20. Therefore, all grounding potentials of the high-frequency probe card 1 common on the grounding plane 21.

Figure 5:
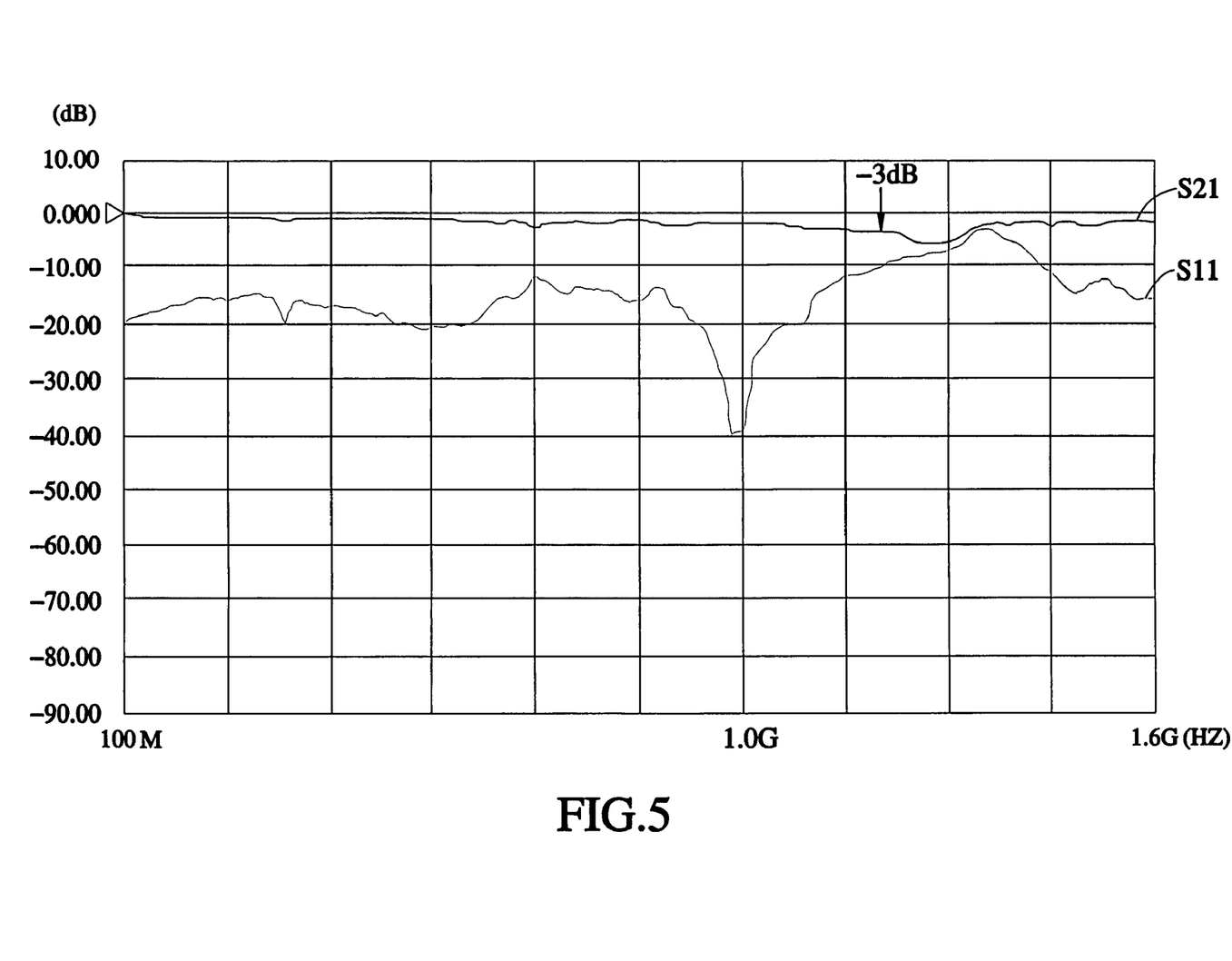
FIG. 5 is a frequency characteristic curve obtained from the transmission lines of the high-frequency probe card according to the first preferred embodiment of the present invention.

After connection of the electronic circuits at the test zone 103 of the high-frequency probe card 1 to the test machine, the signal circuit 11 transmits the test signal to the first lead wire 31 then to the signal probe 41. Because the grounding circuits 12, the second lead wires 32 and the grounding wires 42 are arranged nearby the signal lines 11, the first lead wires 31 and the signal probes 41 respectively, the invention allows effective transmission of high-frequency test signals, maintains the characteristic impedance matching and eliminates unnecessary electric coupling effect. Therefore, the high-frequency probe card 1 provides a high reliability test with high-frequency signal transmission. Further, because each transmission line 30 has a parallel bi-wire structure, characteristic impedance of the transmitted signal is determined subject to the pitch of the wires. The distance between the first lead wire 31 and the second lead wire 32 according to the present invention is equal to the combined wall thickness of the insulating coverings 311 and 321, which can be kept smaller than 1 mm while controlling the characteristic impedance of the test signal within the first lead wire 31 to the standard level as an coaxial cable, i.e., 50-75 Ohm. Therefore, the invention effectively maintains the characteristic impedance of the test signal within the first lead wire 31 without the use of an insulating material with several millimeter of the wall thickness as the insulation tube used in a conventional coaxial cable. Please refer to the frequency characteristic curve of the transmission lines 30 in FIG. 5. As illustrated, the return loss curve S11 of the transmission line 30 measured from 100 MHz to high-frequency range of a few GHz shows an insignificant return loss, i.e., it shows a satisfactory impedance match at the high-frequency range. Further, the insertion loss curve S21 of the transmission line 30 in FIG. 5 shows the passband threshold frequency at gain −3 dB can be as high as 1.2 GHz, having an excellent high-frequency signal transmission quality. Therefore, the high-frequency probe card 1 has low loss and excellent impedance match during transmission of a high-frequency signal. Further, because the diameter of the transmission line 30 is smaller than 1 mm, the count of the transmission lines 30 in the jumping zone 104 can be relatively high for passing high-frequency test signals to a big number of test samples at a time without causing an installation problem of setting the jumped transmission lines that also may affect a probe card's circuit quality.

Figure 6:
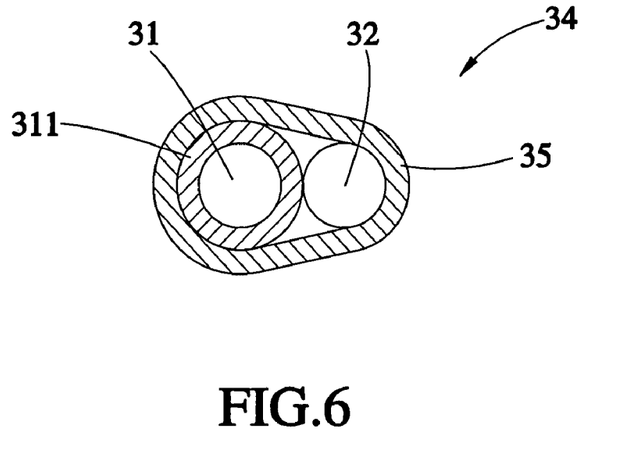
FIG. 6 is a schematic cross sectional view of a transmission line for a high-frequency probe card according to a second preferred embodiment of the present invention.
Figure 7:
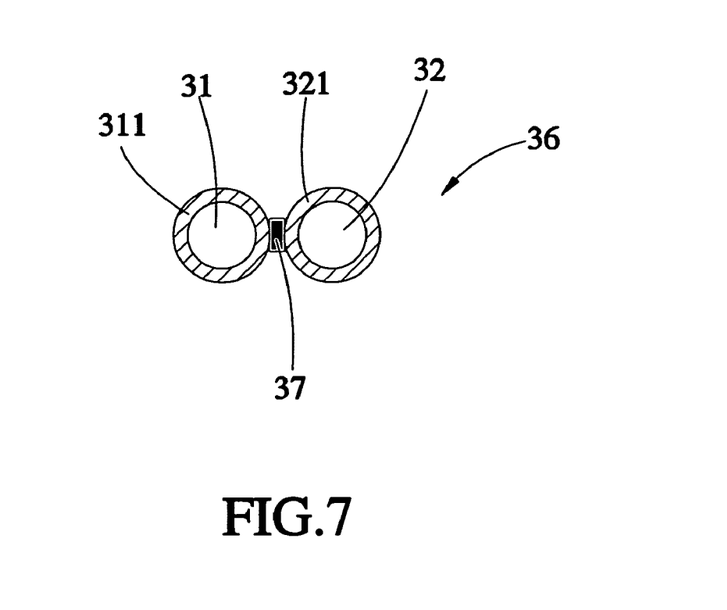
FIG. 7 is a schematic cross sectional view of a transmission line for a high-frequency probe card according to a third preferred embodiment of the present invention.
Figure 8:
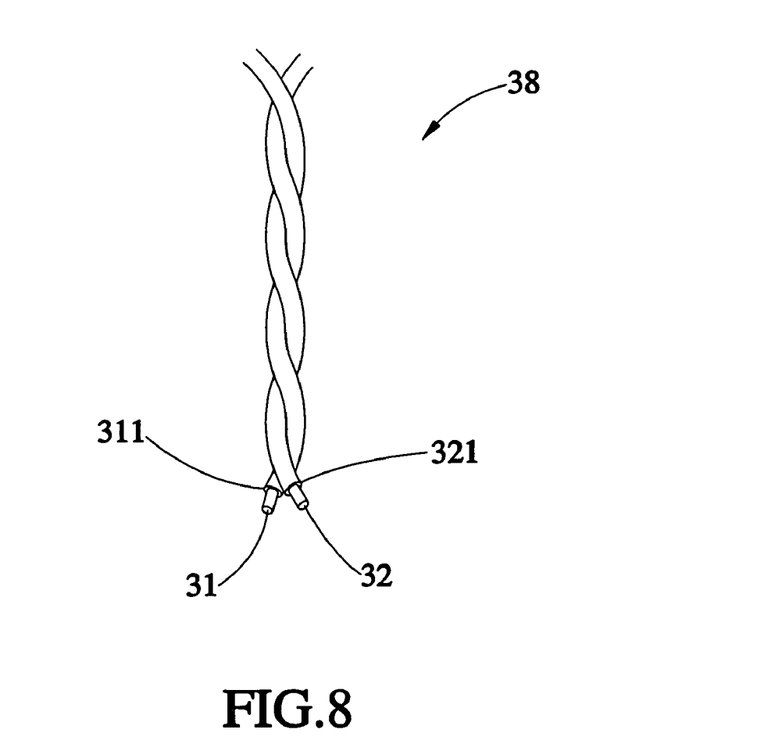
FIG. 8 is a schematic perspective view of a transmission line for a high-frequency probe card according to a fourth preferred embodiment of the present invention.

Because the transmission lines of the present invention are designed to use a bi-wire structure to improve high frequency transmission quality and to lower installation density, they can be made in other alternate forms. FIGS. 6-8 show transmission lines 34, 36, 38 according to second, third and fourth embodiments of the present invention.

As shown in FIG. 6, the transmission line 34 comprises the lead wires 31 and 32, the insulating covering 311 surrounding the first lead wire 31 and an insulating sleeve 35 surrounding outside and holding the first lead wire 31 and the second lead wire 32 firmly in parallel. The pitch between the first lead wire 31 and the second lead wire 32 is equal to the wall thickness of the covering 311, and the characteristic impedance of the high-frequency signal passed by the first lead wire 31 can be controlled to the standard level of 50 Ohm. This embodiment of the transmission lines 34 reduces the diameter of the bi-wire structure, thereby reducing the installation density of the jumped transmission line.

As shown in FIG. 7, the transmission line 36 comprises the lead wires 31 and 32, the insulating covering 311 surrounding the first lead wire 31, the insulating covering 321 surrounding the second lead wire 32 and an adhesion 37 bounding the coverings 311 and 321 and holding the first lead wire 31 and the second lead wire 32 firmly in parallel. This alternate form achieves the same effect as the aforesaid first and second embodiments of the present invention.

As shown in FIG. 8, the transmission line 38 comprises the lead wires 31 and 32, the insulating covering 311 surrounding the first lead wire 31 and the insulating covering 321 surrounding the second lead wire 32. The covering 311 surrounding the first lead wire 31 is twisted with the covering 321 surrounding the second lead wire 32, forming a twisted bi-wire structure. Therefore, the pitch between the first lead wire 31 and the second lead wire 32 is equal to the combined wall thickness of the coverings 311 and 321. Comparing to the aforesaid first, second and third embodiments of the present invention, the transmission line 38 of this fourth embodiment requires less installation space.

Figure 9:
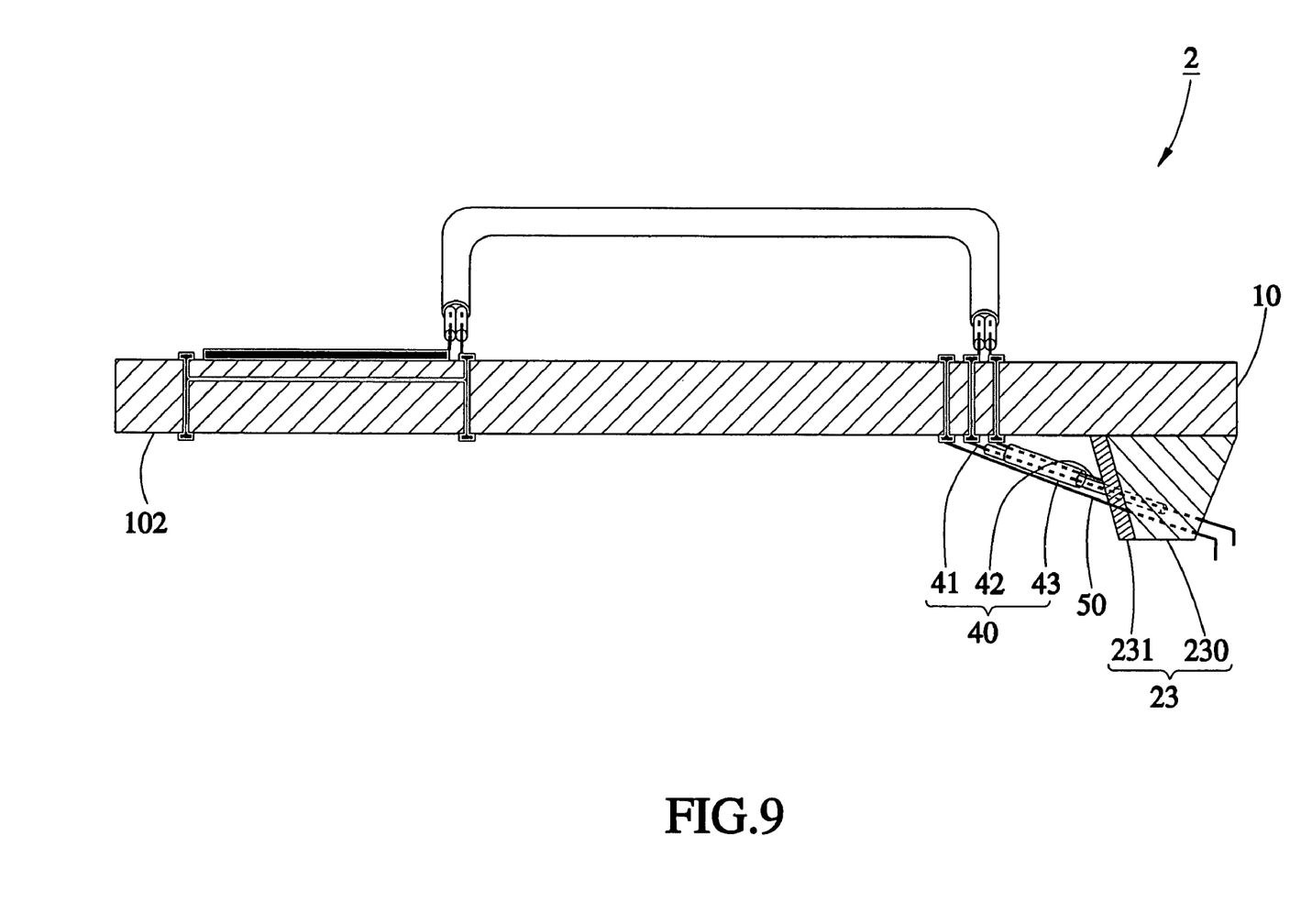
FIG. 9 is a schematic drawing showing the structure of a high-frequency probe card according to a fifth preferred embodiment of the present invention.

Further, the probe holder 20 is adapted to hold the probes 40 and 50 in place and to provide the high-frequency probe card 1 a common ground potential by means of the grounding plane 21. Therefore, the grounding plane 21 can be made in any of a variety of alternate forms. FIG. 9 shows a high-frequency probe card 2 according to a fifth embodiment of the present invention. According to this fifth embodiment, a probe holder 23 has a locating ring 230 and a grounding plane 231. The locating ring 230 is directly affixed to the bottom surface 102 of the circuit board 10, having the same functional structure as the locating ring 22 of the probe holder 20 in either of the aforesaid first to fourth embodiments of the present invention. The grounding plane 231 is provided at the outer peripheral surface of the locating ring 230 for the connection of the grounding wires 42 and the grounding probes 50, providing a common ground potential. Because the locating ring 230 is directly affixed to the bottom surface 102 of the circuit board 10, this arrangement eliminates the problem of displacement of the locating ring 230 relative to the circuit board 10 resulted from the thermal expansion or contraction of a metal material placed between the locating ring 230 and the circuit board 10. Therefore, the locating ring 230 does not displace subject to severe change of the ambient temperature, and the probes 40 and 50 are constantly held in position for accurate probing.

Figure 10:
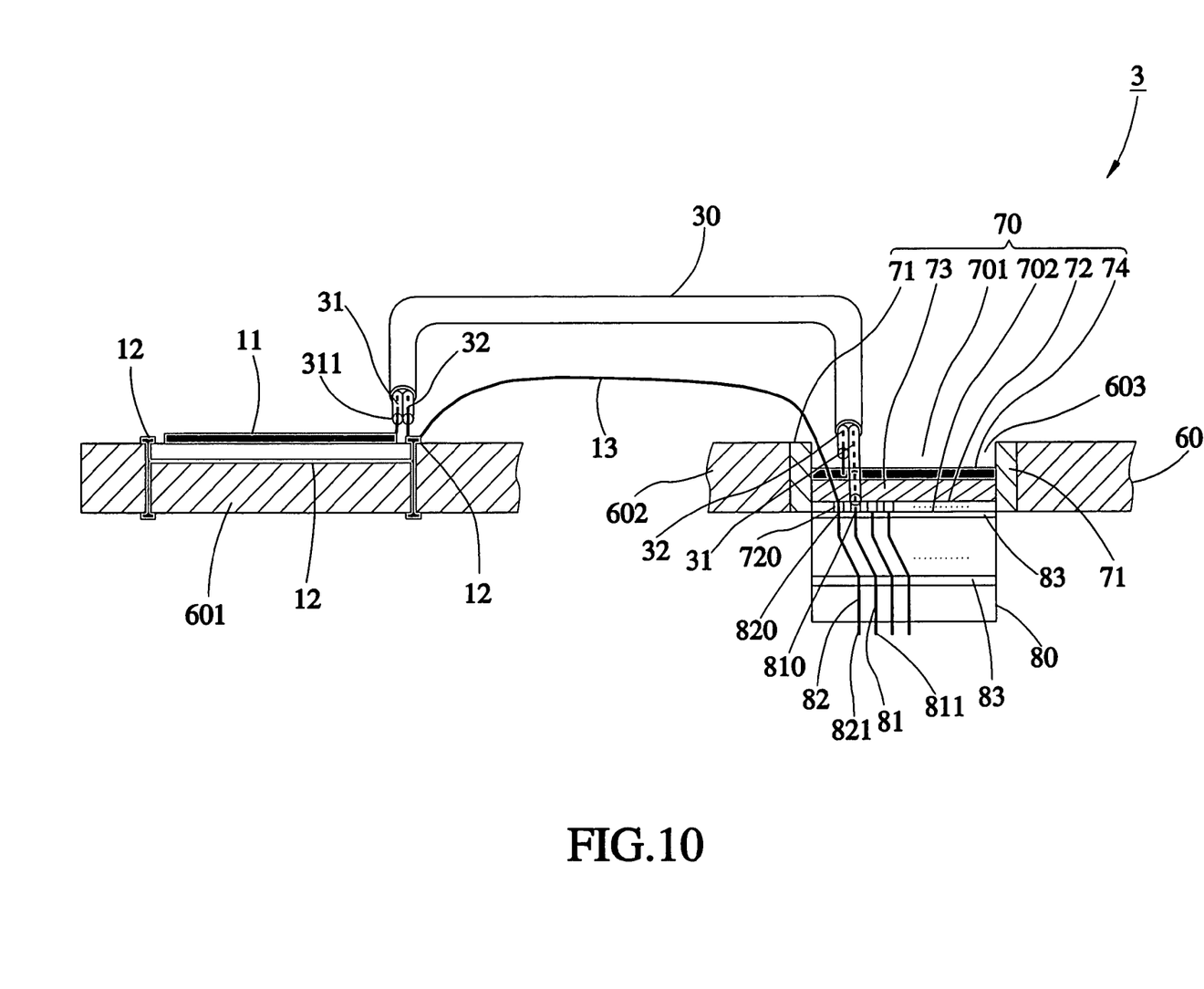
FIG. 10 is a schematic drawing showing the structure of a high-frequency probe card according to a sixth preferred embodiment of the present invention.

FIG. 10 shows a vertical probe card 3 according to a sixth embodiment of the present invention. According to this embodiment, the vertical probe card 3 comprises a circuit board 60, a probe holder 70, a probe set 80, and transmission lines 30.

The circuit board 60 having a ring shape defines an annular outer test zone 601, an annular inner jumping zone 602 concentrically surrounded by the test zone 601, and a center hole defining a probe zone 603 centered on the circuit board 60 and surrounded by the jumping zone 602 for accommodating the probe holder 70. Same as the aforesaid various embodiments of the present invention, the test zone 601 of the circuit board 60 has signal circuits 11 and grounding circuits 12 respectively electrically connected to the first and second lead wires 31 and 32 of the transmission lines 30. The circuit board 60 further has a plurality of grounding wires 13 respectively electrically connected to the grounding circuits 12. The transmission lines 30 and the grounding wires 13 extend from the test zone 601 to the jumping zone 602 then to the probe holder 70.

The probe holder 70 is mounted in the probe zone 603, having an annular upright sidewall 71 abutted against the periphery wall of the center hole of the circuit board 60, a bottom wall 72 within the sidewall 71, a top open chamber 701 defined above the bottom wall 72 and surrounded by the sidewall 71 for receiving the transmission lines 30 and the grounding wires 13, a bottom surface 702 defined beneath the bottom wall 72, an insulating layer 73 covered on the top surface of the bottom wall 72, and a grounding plane 74 covered on the top surface of the insulating layer 73. The sidewall 71 and the grounding plane 74 are made of metal materials. The bottom wall 72 and the insulating layer 73 are made of insulating materials. The bottom wall 72 has a plurality of through holes 720 each of which has a diameter corresponding to the diameter of the covering 311 of the first lead wire 31. The first lead wires 31 with the respective coverings 311 are inserted through the grounding plane 74 into the inside of the insulating layer 73 and ended in the respectively through holes 720 of the bottom wall 72, and then suspending in the bottom surface 702. The second lead wires 32 are electrically connected to the grounding plane 74. The grounding wires 13 are electrically connected to the ground plane 74 and inserted through the insulating layer 73 into the respectively through holes 720 of the bottom wall 72. Therefore, the first lead wires 31 and the grounding wires 13 are respectively exposed on the bottom surface 702.

The probe set 80 is installed on the bottom surface 702 of the probe holder 70, including a plurality of signal probes 81 and a plurality of grounding probes 82. The signal probes 81 and the grounding probes 82 are respectively made of metal material having a predetermined hardness. The signal probes 81 and the grounding probes 82 are perpendicularly fastened to two insulating locating plates 83. A rear end 810 of each signal probe 81 is connected to the first lead wire 31 in the respective through hole 720. A rear end 820 of each grounding probe 82 is connected to the grounding wire 13 in the respective through hole 720. Further, a plurality of tips 811 and 821 of the respective probes 81 and 82 are suspending beneath the lower locating plate 83 for touching test samples.

Thus, the probe card 3 uses the transmission lines 30 to directly pass test signals to the signal probes 81 and then the test samples. This embodiment eliminates the aforesaid solder pads 105 and 106 at the jumping zone 104 of the circuit board 10 to have the test signal transmitted through the circuit board 10 to the high-frequency probes 40, thereby preventing dielectric loss induced by the dielectric material of the circuit board 10 or return loss resulted from the characteristic impedance mismatching during signal transmission through different media. Therefore, the probe card 3 not only allows installation of the transmission lines 30 in a high count manner, but also provides a better reliability test in the high-frequency signals transmission for maintaining the characteristic impedance.

Figure 11:
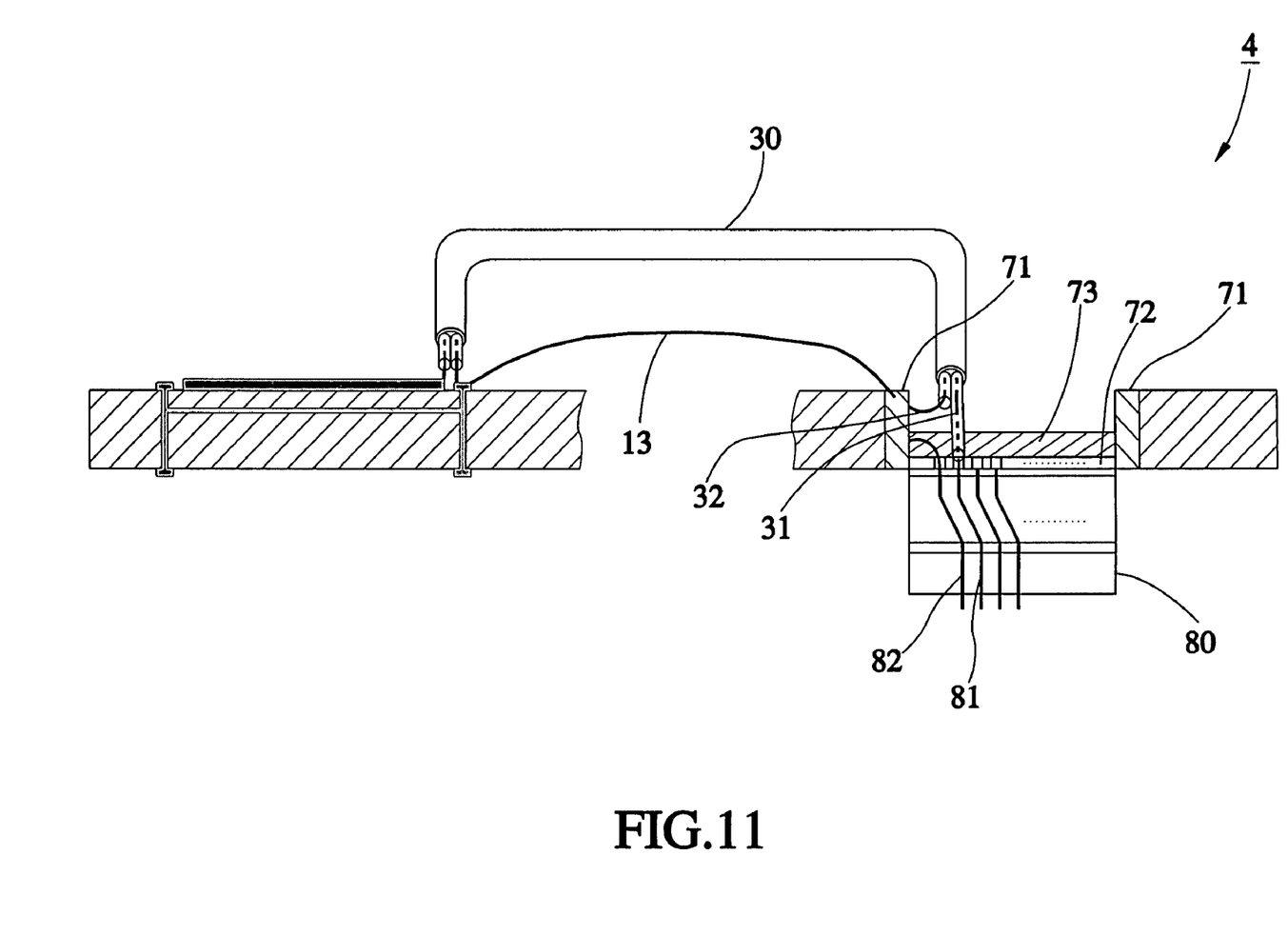
FIG 11 is a schematic drawing showing the structure of a high-frequency probe card according to a seventh preferred embodiment of the present invention.

The common ground potential provided by the probe holder 70 is not limited to the arrangement of the grounding plane 74. FIG. 11 shows a probe card 4 according to a seventh embodiment of the present invention. This embodiment eliminates the grounding plane 74 from the probe holder 70, and directly uses the sidewall 71 to provide the desired common ground potential, i.e., the second lead wires 32 and the grounding wires 13 are electrically connected to the sidewall 71, and the sidewall 71 is electrically connected to the grounding probes 82. This embodiment achieves the same effects as the aforesaid sixth embodiment of the present invention.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A high-frequency probe card comprising:
   a circuit board having a plurality of signal circuits and a plurality of grounding circuits respectively spaced from said signal circuits at a predetermined pitch and respectively electrically connected to a zero potential;
   a plurality of transmission lines disposed outside said circuit board, each of said transmission lines having a first lead wire electrically connected to one of said signal circuits, a second lead wire electrically connected to one of said grounding circuits, and a first electrically insulating covering axially covered on said first lead wire, said first lead wire and second lead wire being made of metal, arranged side by side, and spaced from each other at a predetermined pitch; and
   a plurality of signal probes and at least one grounding probe respectively made of metal, said signal probes being respectively electrically connected to the first lead wires of said transmission lines, said at least one grounding probe being electrically connected to the zero potential.

2. The high-frequency probe card as claimed in claim 1, which said circuit board has a top surface, a bottom surface opposite to said top surface, an outer test zone and an inner jumping zone, wherein the said grounding circuits on the top surface within the test zone are respectively spaced around said signal circuits at a predetermined pitch.

3. The high-frequency probe card as claimed in claim 2, wherein said circuit board has a plurality of solder pads arranged on said top surface and said bottom surface within said jumping zone, said solder pads including a plurality of signal solder pads and a plurality of grounding solder pads, the signal solder pads and the grounding solder pads at said top surface being respectively connected to the signal solder pads and the grounding solder pads at said bottom surface by said signal circuits and said grounding circuits respectively, the signal solder pads at said top surface being respectively connected to the first lead wires of said transmission lines, the signal solder pads at said bottom surface being respectively connected to said signal probes.

4. The high-frequency probe card as claimed in claim 1, further comprising a probe holder disposed at said circuit board for holding said signal probes and said at least one grounding probe, said probe holder having a grounding plane made of an electrically conductive material, wherein said at least one grounding probe is electrically connected to the grounding plane of said probe holder.

5. The high-frequency probe card as claimed in claim 4, further comprising a plurality of grounding wires, each of which is parallel arranged with one of said signal probes and electrically connected to said at least one grounding circuit of said circuit board and said grounding plane of said probe holder.

6. The high-frequency probe card as claimed in claim 5, wherein each of said signal probes is axially covered with an electrically insulating covering, which has a thickness equal to the pitch between the signal probe and the grounding wire.

7. The high-frequency probe card claimed in claim 4, wherein said probe holder comprises a locating ring made of an electrically insulating and shock absorbing material for holding bodies of said grounding probes and bodies of said signal probes, keeping tips of said grounding probes and tips of said signal probes be suspended in an annular opening of the locating ring.

8. The high-frequency probe card as claimed in claim 7, wherein said locating ring is mounted to said circuit board; said grounding plane is provided at a peripheral wall of said locating ring.

9. The high-frequency probe card as claimed in claim 1, wherein said circuit board has a ring shape with a center hole in which a probe holder is accommodated, wherein said probe holder has a bottom wall made of an insulating material, a top open chamber, an insulating layer covered on a top surface of said bottom wall; wherein said transmission lines extend from said circuit board to said top open chamber of said probe holder, having the first lead wires of said transmission lines respectively be inserted through said insulating layer and said bottom wall and exposed on a bottom surface of said bottom wall of said probe holder.

10. The high-frequency probe card as claimed in claim 9, wherein said signal probes are mounted to said bottom surface of said probe holder and respectively connected to the first lead wires of said transmission lines.

11. The high-frequency probe card as claimed in claim 10, wherein said circuit board comprises at least one grounding wire made of metal and electrically connected to said grounding circuits; the grounding wire extends from said circuit board to said top open chamber of said probe holder and is inserted through said insulating layer and said bottom wall of said probe holder and exposed on said bottom surface of said probe holder.

12. The high-frequency probe card as claimed in claim 11, wherein said probe holder further comprises a grounding plane covered on said insulating layer and made of metal; the second lead wires of said transmission lines and said grounding wire are electrically connected to said grounding plane.

13. The high-frequency probe card as claimed in claim 12, wherein said at least one grounding probe is mounted to said bottom surface of said probe holder and connected to said at least one grounding wire of said circuit board.

14. The high-frequency probe card as claimed in claim 10, wherein said probe holder has an upright sidewall made of metal and abutted against a periphery wall of the center hole of said circuit board; the second lead wires of said transmission lines and said at least one grounding probe are electrically connected to the upright sidewall of said probe holder.

15. The high-frequency probe card as claimed in claim 1, wherein said first electrically insulating covering has an inner diameter substantially equal to a diameter of said first lead wire.

16. The high-frequency probe card as claimed in claim 15, wherein the predetermined pitch between the first lead wire and the second lead wire is equal to a wall thickness of the first electrically insulating covering.

17. The high-frequency probe card as claimed in claim 1, wherein the predetermined pitch between said first lead wire and said second lead wire is smaller than 1 mm.

18. The high-frequency probe card as claimed in claim 1, further comprising a second electrically insulating covering axially covered on said second lead wire and abutted with the first electrically insulating covering.

19. The high-frequency probe card as claimed in claim 1, further comprising an electrically insulating sleeve axially sleeved onto said first lead wire that is axially covered by the first electrically insulating covering and said second lead wire.

20. The high-frequency probe card as claimed in claim 19, wherein said electrically insulating sleeve has an inner diameter substantially equal to a sum of an outer diameter of said first electrically insulating covering and a diameter of said second lead wire.

21. The high-frequency probe card as claimed in claim 18, further comprising an electrically insulating sleeve axially sleeved onto said first and second electrically insulating coverings; wherein said electrically insulating sleeve has an inner diameter substantially equal to a sum of outer diameters of said first and second electrically insulating coverings.

* * * * *